United States Patent [19]
Hao

[11] Patent Number: 6,153,461
[45] Date of Patent: Nov. 28, 2000

[54] MANUFACTURING METHOD OF A DIELECTRIC LAYER FOR DRAM CAPACITORS

[75] Inventor: Ging-Chao Hao, Hsinchu, Taiwan

[73] Assignee: United Microelectronics Corp., Hsin-Chu, Taiwan

[21] Appl. No.: 08/997,496

[22] Filed: Dec. 23, 1997

[30] Foreign Application Priority Data

Oct. 18, 1997 [TW] Taiwan ................................. 86115357

[51] Int. Cl.$^7$ .............................................. H01L 21/8242
[52] U.S. Cl. ...................... 438/240; 438/381; 438/399; 438/398; 438/791; 438/526; 438/530
[58] Field of Search .................................. 438/381, 399, 438/239, 240, 253, 398, 396, 791, 526, 528, 530

[56] References Cited

U.S. PATENT DOCUMENTS

| | | | |
|---|---|---|---|
| 4,045,250 | 8/1977 | Dingwall | 148/1.5 |
| 4,243,433 | 1/1981 | Gibbons | 148/1.5 |
| 5,250,456 | 10/1993 | Bryant | 437/47 |
| 5,429,972 | 7/1995 | Anjum et al. | 437/47 |
| 5,654,209 | 8/1997 | Kato | 438/528 |

OTHER PUBLICATIONS

Wolf, S. and Tauber, R. N., Silicon Processing for the VLSI Era vol. 1—Process Technology, Scientific Library U.S.P.T.O. pp. 516–517, 1986.

Wolf, S. Silicon Processing for the VLSI Era vol. 2—Process Integration, Scientific Library U.S.P.T.O. pp. 186–189., 1990.

*Primary Examiner*—Matthew Smith
*Assistant Examiner*—Reuzo Rocchegiani
*Attorney, Agent, or Firm*—J.C. Patents; Jiawei Huang

[57] ABSTRACT

A manufacturing method of a dielectric layer for a dynamic random-access-memory capacitor comprising, at first, providing a substrate which has a first conductive layer for the capacitor implanting ions into the first conductive layer. Next, performing a anneal process so as to form the dielectric layer, and then performing a cleaning process with a resolution. Finally, forming a second conductive layer over the first conductive layer. By the manufacturing steps in this invention, it can reduce a thickness of the dielectric layer and increase the dielectric constant, so that charges which can be stored in per unit area of the capacitor without reducing the integration of the DRAM device. Furthermore, it will not reduce the integration of the DARM device.

18 Claims, 3 Drawing Sheets

MANUFACTURING METHOD OF A DIELECTRIC LAYER FOR DRAM CAPACITORS

BACKGROUND OF THE INVENTION

1. Field of Invention

This invention relates in general to manufacturing method of a dielectric layer for dynamic random-access-memory (DRAM) capacitors, and more particularly to the manufacturing method of a dielectric layer that can improve a capability of storing charges in capacitors of DRAM.

2. Description of Related Art

DRAM is a kind of volatile memory whose digital signals are stored according to the charging state of the respective capacitors in each of the memory cells. Each memory cell is included of a MOS transistor and a capacitor. The capacitor is the important part of the memory cell. The more charges stored in the capacitor, the less effect produced by reading data stored in the cell, and the less times for refreshing the memory cell. The conventional methods for increasing the charges stored in the capacitor of the memory cell are: (1) increasing the surface of the capacitor, it increases charges stored in the whole capacitor, but it results in reducing integration of the DRAM devices; (2) using a proper materials of the dielectric layer for increasing a dielectric constant thereof, it makes charges stored in an unit-area of the capacitor increasing; (3) reducing the thickness of the dielectric layer, but it is restricted to a minimum thickness owing to features of the dielectric layer and the technique of manufacturing.

The conventional manufacturing method of a dielectric layer of the DRAM capacitor is forming an ONO (Oxide-nitride-oxide) layer, that is, depositing dielectric materials onto a lower electrode layer of the capacitor in the DRAM, implementing a process of oxidation, and then depositing an upper electrode onto the dielectric layer. After that, a structure of the capacitor in the DRAM will be implemented. Referring to FIG. 1A to FIG. 1C, it shows a conventional manufacturing method of a DRAM capacitor, At first, referring to FIG. 1A, parts of a MOS transistor and a substrate in a DRAM memory cell are skipped and are not shown. The lower electrode 14 of the capacitor is made up of, for example, polysilicon. There is a conducting line 10 below the lower electrode 14 for connecting source/drain regions (not shown) of the MOS transistor. The isolating layer 12 is, for example, an inter poly dielectric and is for isolating from the other memory cells.

Next, referring to FIG. 1B, when the lower electrode 14 is already formed, there is a native oxide layer in sequence formed over a surface of the lower electrode 14 with a circumstance filled with oxygen. The reaction can be performed at room temperature, and therefore the native oxide layer is formed as a very thin layer which is the first layer of three layers constituting a structure of the ONO layer. But the native oxide layer is not suitable for being a dielectric layer of the capacitor owing to its small dielectric constant. Therefore, it is usually peeled by an acidic reaction process, for example, with hydrofluoric acid. Then a nitride layer 16, for example, a silicon nitride, is formed as a second layer of the ONO structure. The nitride layer 16 improves features of the dielectric layer of the capacitor owing to its high dielectric constant.

Then, referring to FIG. 1C, because the nitride layer 16 is formed with a process of deposition. There are some pinholes formed in the surface of the nitride layer 16 after depositing. It results in a situation that a leakage current is found after depositing conductive materials in following steps onto the nitride layer 16 because these pinholes in the nitride layer 16 are filled with these conductive materials. Avoiding this situation happens, a very thin silicon dioxide layer 18 is usually formed by an oxidation method onto the nitride layer 16 in order to fill the pinholes before these conductive materials are deposited. The silicon dioxide layer 18 is the third layer of the ONO structure. Next, a upper electrode 24 is deposited onto the silicon dioxide layer 18 and then a method of manufacturing the capacitor is performed.

The convention method for the nitride layer of the ONO structure is formed by depositing. It will not be possible to form a very thin nitride layer. Furthermore, the silicon dioxide layer above the nitride layer will cause the dielectric constant of the dielectric layer reduced because of a low dielectric constant of the silicon dioxide layer. These defects will effect features of the DRAM.

SUMMARY OF THE INVENTION

It is therefore an object of this invention to provide a manufacturing method for DRAM capacitors that can reduce a thickness of the dielectric layer and increase the dielectric constant, so that charges which can be stored in per unit area of the capacitor with out reducing t he integration of the DRAM device.

To achieve the above and other objects, this invention providing a manufacturing method of a dielectric layer for a dynamic random-access-memory capacitor comprising, at first, providing a substrate which has a first conductive layer for the capacitor implanting ions into the first conductive layer. Next, performing a anneal process so as to form the dielectric layer, and then performing a cleaning process with a resolution. Finally, forming a second conductive layer over the first conductive layer

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

FIGS. 2A through 2D are a series of cross-sectional views outlining the manufacturing procedure for a DRAM capacitor according to one preferred embodiment of this invention.

Figure 1A:
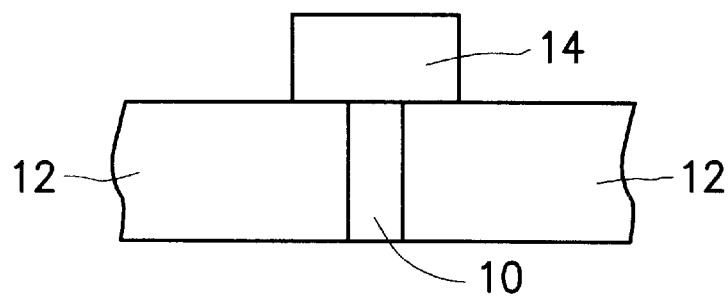
FIG. 1A through 1C are a series of cross-sectional views showing a conventional manufacturing steps of DRAM capacitor.
Figure 1B:
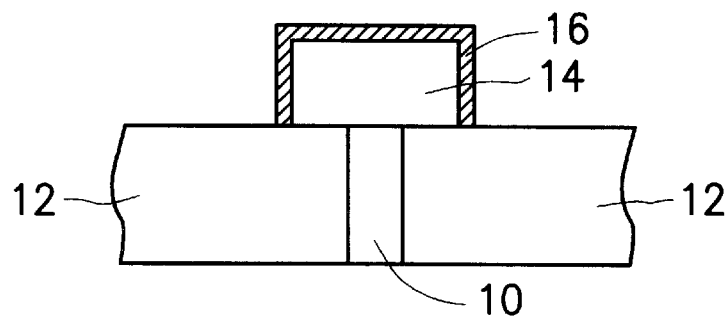
Figure 1C:
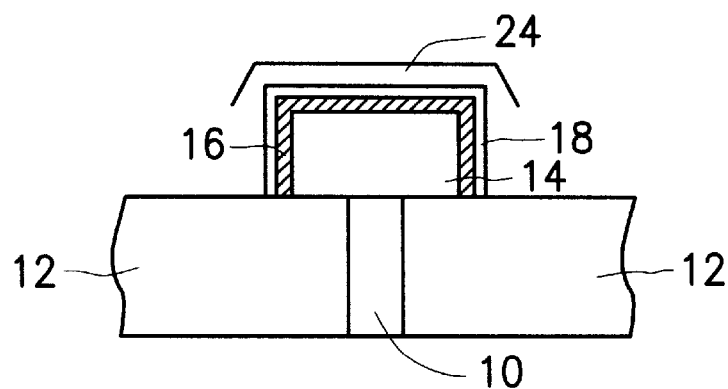
Figure 2A:
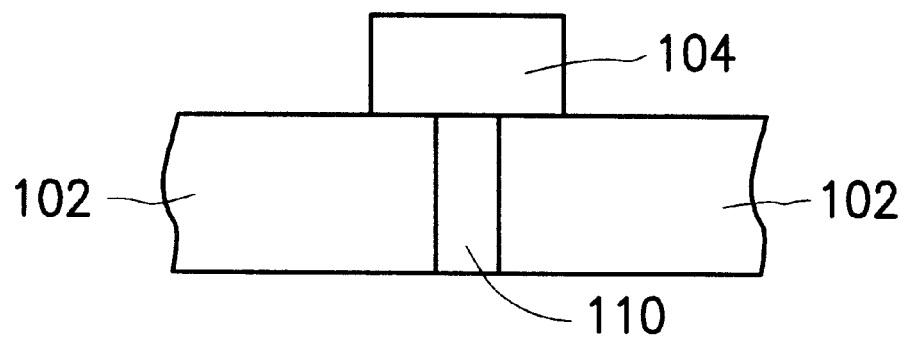
FIGS. 2A through 2D are a series of cross-sectional views outlining the manufacturing procedure for a DRAM capacitor according to one preferred embodiment of this invention.

First, referring to FIG. 2A, for clearly pointing out features of this embodiment, parts of a MOS transistor and a substrate in a DRAM memory cell are skipped and are not shown. The lower electrode 104 of the capacitor is made up of, for example, polysilicon. There is a conducting line 10 below the lower electrode 104 for connecting source/drain regions (not shown) of the MOS transistor. The isolating layer 102, for example, an inter poly dielectric layer, is for isolating from the other memory cells. The isolating layer 102 is made up by, for example, PETEOS (plasma-enhances-tetra-ethyl-ortho-silicide), BPSG (borophosphosilicate glass), or PSG (phosphosilicate glass).

Figure 2B:
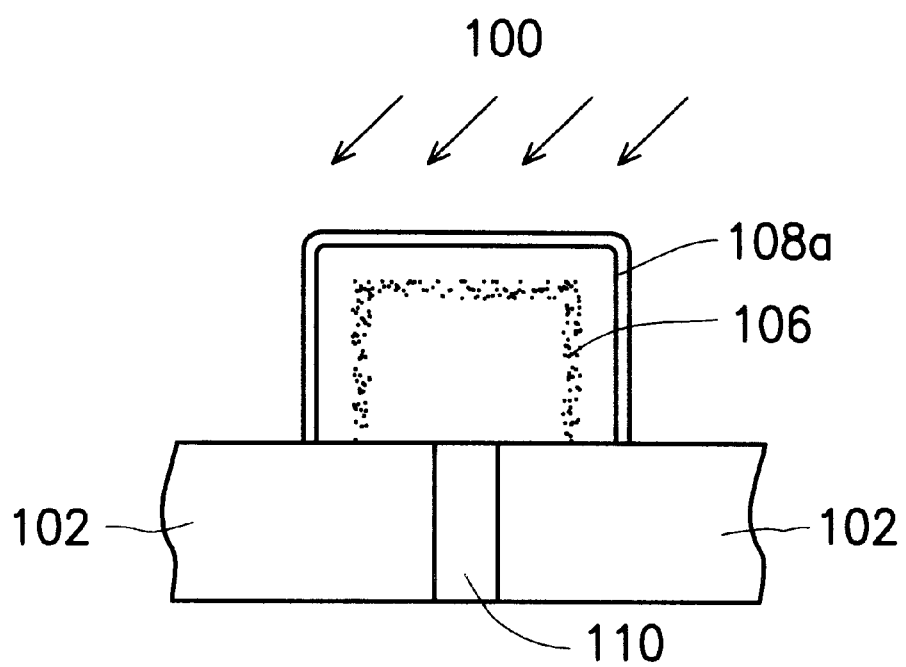

Next, referring to FIG. 2B, when the lower electrode 104 is already formed, there is a native oxide layer 108a in sequence formed over a surface of the lower electrode 104 with a circumstance filled with oxygen. The reaction can be performed at room temperature, and therefore the native oxide layer 108a is formed as a very thin layer. Then implants 100, such as nitrogen ions, are implanted into the lower electrode 104 through the native oxide layer 108a. The implanting is performed at an angle of 7°~15° so that two sides of the lower electrode 104 can also be implanted some nitrogen ions. The implanted nitrogen ions 100 exist in the inner of the lower electrode 104 with the implanting process. By changing an energy used in the implanting, a depth of the nitrogen ions 100 existed in lower electrode 104 can be controlled. Rather, by changing the dosage of the implants, a distribution of the nitrogen ions 100 existed in the lower electrode 104 can be easily controlled.

Figure 2C:
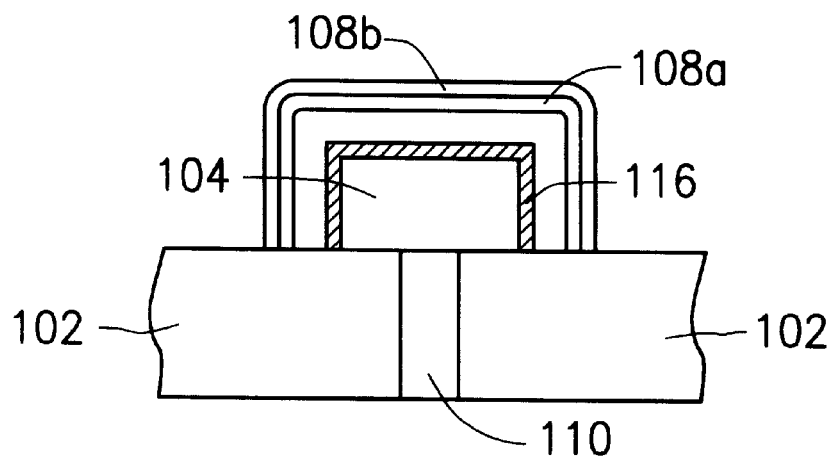

Next, referring to FIG. 2C, with an anneal process, for example, a RTA (Rapid thermal anneal) process at the temperature of about 700° C.~1000° C., the nitrogen ions 100 of the lower electrode 104 are reacted with silicon. After that, a silicon nitride layer 110 is generated inside the lower electrode 104. There exists a predetermined depth between the silicon nitride 116 and the surface of the lower electrode. This reaction should be rapidly reacted in a condition of high temperature, otherwise it will cause the diffusion of the nitrogen 100 inside the lower electrode 104 during the reaction. In addition, a native oxide layer 108b is formed during the anneal process. The silicon nitride layer 116 according to this embodiment will not have a disadvantage of leakage current owing to the pinholes generated in the silicon nitride layer 116. Rather, it does not have to form an additional silicon dioxide layer in order to fill the pinholes in the silicon nitride layer 116. Furthermore, by properly controlling the reaction conditions the thickness of the silicon nitride layer 116 can be very thin without changing the feature of the dielectric layer. Even the thickness of the silicon nitride layer is the same as the thickness of a nitride layer formed by a conventional method, an "effective thickness" of the silicon nitride layer 116 can be extremely reduced because of the absence of the silicon dioxide. In addition, a conventional problem of reduction of the dielectric constant will not happen.

Figure 2D:
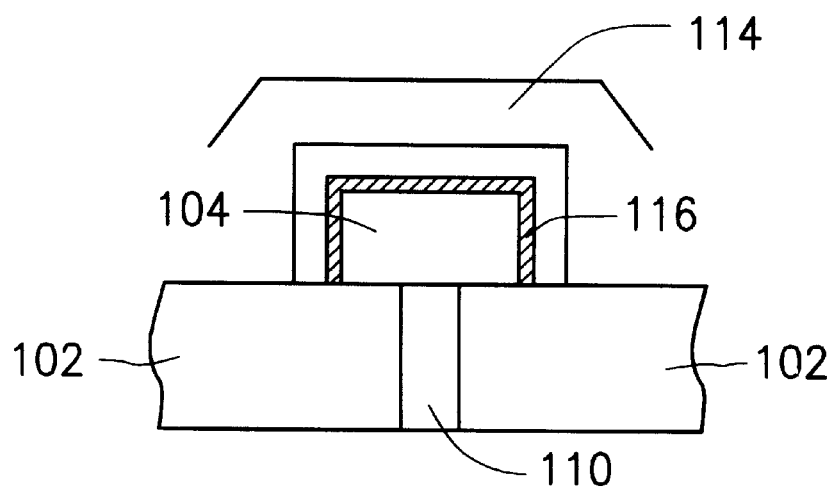

Next, referring to FIG. 2D, performing a cleaning process with an acid solution, for example, a hydrofluoric acid solution in order to peer the oxide layers with a low dielectric constant. The peeled oxide layers includes the native oxide layer 108a, which is formed after performing a deposition of the lower electrode 104, and the silicon dioxide layer 108b, which is formed after performing an anneal process. Finally, an upper electrode 114 is formed over the lower electrode 104. The upper electrode 114 is made up by, for example, polysilicon. Manufacturing steps of the DRAM capacitor is then is accomplished.

With the manufacturing steps for DRAM capacitor in this embodiment, it can reduce a thickness of the dielectric layer and increase the dielectric constant, so that charges which can be stored in per unit area of the capacitor without reducing the integration of the DRAM device. Furthermore, it will not reduce the integration of the DARM device.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A manufacturing method of a dielectric layer for a dynamic random-access-memory capacitor comprising steps of:
   providing a substrate, the substrate has a first conductive layer for the capacitor;
   implanting ions into the first conductive layer;
   performing an anneal process to react the implanted ions with silicon of the first conductive layer to form the dielectric layer inside the first conductive layer;
   after the dielectric layer is formed, performing a cleaning process with a solution; and
   after the cleaning process is performed, forming a second conductive layer over the first conductive layer.

2. The method of claim 1, wherein the first conductive layer is polysilicon.

3. The method of claim 1, wherein the second conductive layer is polysilicon.

4. The method of claim 1, wherein the ions are nitrogen ions.

5. The method of claim 1, wherein the dielectric layer is silicon nitride.

6. The method of claim 5, wherein the silicon nitride is formed inside the first conductive layer.

7. The method of claim 1, wherein the solution is hydrofluoric acid solution.

8. The method of claim 1, wherein the cleaning process is used for peeling a silicon dioxide formed over the first conductive layer.

9. The method of claim 8, wherein the silicon dioxide includes a native oxide layer formed in the anneal process.

10. The method of claim 1, wherein there is a silicon dioxide layer formed over the first polysilicon layer immediately before the step of implanting ions into the first polysilicon layer.

11. A manufacturing method of a dielectric layer for a dynamic random-access-memory capacitor comprising steps of:
    providing a substrate, the substrate has a first polysilicon layer for the capacitor;
    implanting ions into the first polysilicon layer;
    performing an anneal process to react the implanted ions with the silicon of the first polysilicon layer to form the dielectric layer, wherein the dielectric layer substantially contains no silicon dioxide and is located inside the first polysilicon layer;
    performing a cleaning process; and
    after the cleaning process is performed, depositing a second polysilicon layer over the dielectric layer and the first polysilicon layer.

12. The method of claim 11, wherein the implanting step is performed at an angle of 7°–15°, so that the two sides of the first polysilicon layer can be implanted with some of the ions.

13. The method of claim 11, wherein the ions are nitrogen ions.

14. The method of claim 11, wherein the dielectric layer is silicon nitride.

15. The method of claim 11, wherein a hydrofluoric acid solution is used in the cleaning process.

16. The method of claim 11, wherein there is a silicon dioxide layer formed over the first polysilicon layer before the step of implanting ions into the first polysilicon layer.

17. The method of claim 16, wherein the cleaning process is used for peeling the silicon dioxide formed over the first polysilicon layer.

18. The method of claim 17, wherein the silicon dioxide includes a native oxide layer formed in the anneal process.

* * * * *